(12) United States Patent
Enk

(10) Patent No.: US 6,693,437 B2
(45) Date of Patent: Feb. 17, 2004

(54) METHOD AND APPARATUS FOR IDENTIFYING STATE-DEPENDENT, DEFECT-RELATED LEAKAGE CURRENTS IN MEMORY CIRCUITS

(75) Inventor: Klaus Enk, Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 98 days.

(21) Appl. No.: 09/997,135

(22) Filed: Nov. 28, 2001

(65) Prior Publication Data

US 2003/0098693 A1 May 29, 2003

(51) Int. Cl.$^7$ .............................................. G01R 31/28
(52) U.S. Cl. ...................................... 324/537; 324/522
(58) Field of Search ...................... 365/185.09, 185.02, 365/185.19, 45; 714/718, 719, 732, 736, 737; 702/117; 324/158.1, 765, 500, 522, 537, 719

(56) References Cited

U.S. PATENT DOCUMENTS

| 4,710,932 A | * | 12/1987 | Hiroshi | ........................ 714/736 |
| 4,942,576 A | * | 7/1990 | Busack et al. | .............. 714/719 |

* cited by examiner

Primary Examiner—N. Le
Assistant Examiner—Vincent Q. Nguyen
(74) Attorney, Agent, or Firm—Ladas & Parry

(57) ABSTRACT

An apparatus for identifying state dependent defect related leakage currents in a tested circuit with a defect. The apparatus includes a test system providing an input signal and an operating voltage, and a reference circuit the same as the tested circuit but without the defect receiving the input signal and the operating voltage, and operating at a first operating current, wherein, the tested circuit also receives the input signal and the operating voltage, and operates at a second operating current, and the test system senses a difference of the first and second operating current.

5 Claims, 2 Drawing Sheets

METHOD AND APPARATUS FOR IDENTIFYING STATE-DEPENDENT, DEFECT-RELATED LEAKAGE CURRENTS IN MEMORY CIRCUITS

BACKGROUND OF THE INVENTION

1. Field of the Invention

The present invention relates to an apparatus for memory circuit testing, particularly to an apparatus for identifying state-dependent, defect-related leakage currents in memory circuits.

2. Description of the Prior Art

Conventional defect analysis techniques for memory circuits such as hot spot liquid crystal analysis or emission microscopy are performed on a single defective circuit. This can be done in a static mode by applying a DC voltage bias or in a dynamic mode while running a test pattern with varying addresses. These two methods can be combined with an operating current measurement. In general, these methods are not very efficient and accurate for the identification of defect related state dependent leakage currents. Hot spot liquid crystal analysis, emission microscopy, and a combination of both methods with an operating current measurement have the following disadvantages for the case of a single defective circuit under analysis. In the static mode, a defect might not cause any additional leakage contribution if the shorted circuit parts are on the same voltage level. In the dynamic mode, a defect can only be detected for certain critical addresses but there is no systematic way of identifying or triggering such critical addresses. Even adding an operating current measurement in parallel does not guarantee an accurate detection of critical addresses. The total operating current $I_{tot}(x,y)$ for a memory cell having address (x,y) is an overlay of the contribution $I_{def}(x,y)$ of a defect and the contribution $I_{cir}(x,y)$ of all circuit elements. That is to say, $I_{tot}(x,y)=I_{def}(x,y)+I_{cir}(x,y)$. However, both $I_{def}(x,y)$ and $I_{cir}(x,y)$ are dependent on the address (x,y) and inseparable from the perspective of $I_{tot}(x,y)$.

SUMMARY OF THE INVENTION

Therefore, the object of the present invention is to provide a method and apparatus for memory circuit testing, which accurately identifies addresses of defective memory cells and detects leakage currents therein.

The present invention provides an apparatus for identifying state dependent defect related leakage currents in a tested circuit with a defect. The apparatus comprises a test system providing an input signal and an operating voltage, and a reference circuit the same as the tested circuit but without the defect receiving the input signal and the operating voltage, and operating at a first operating current, wherein, the tested circuit also receives the input signal and the operating voltage, and operates at a second operating current, and the test system senses a difference of the first and second operating current.

The present invention also provides an apparatus for identifying state dependent defect related leakage currents in a tested memory circuit with a defective cell. The apparatus comprises a test system providing an address signal and an operating voltage, and a reference memory circuit the same as the tested memory circuit but without the defective cell receiving the address signal and operating at a first operating current, wherein, the tested memory circuit also receives the address signal and the operating voltage, and operates at a second operating current, and the test system senses a difference of the first and second operating current.

The present invention further provides a computer-implemented method for identifying state dependent defect related leakage currents in a tested memory circuit with a tested cell using a reference memory circuit. The method comprises the steps of providing an address signal of the tested cell and an operating voltage to the reference and tested memory circuit so that the reference and tested memory circuit operate at a first and second operating current respectively, comparing the first and second operating current to obtain a difference of the first and second operating current; and deciding the tested cell as a defective cell when the difference is larger than a threshold value.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
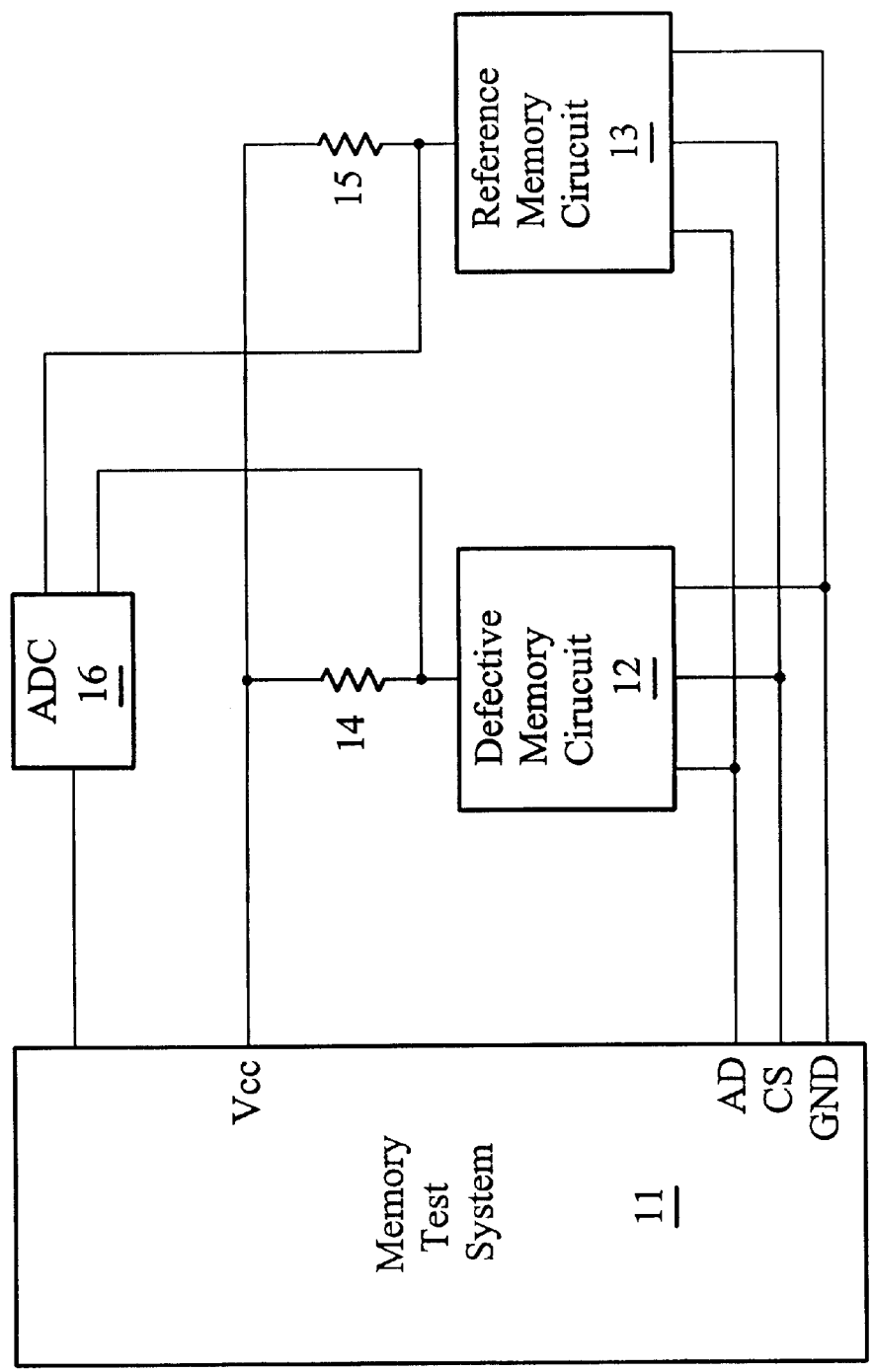
FIG. 1 is a diagram showing an apparatus for identifying state dependent defect related leakage currents in memory circuits according to one embodiment of the invention.

FIG. 1 is a diagram showing an apparatus for identifying state dependent defect related leakage currents in memory circuits according to one embodiment of the invention.

The apparatus comprises a computer-based memory test system 11, a defective memory circuit under test 12, a reference memory circuit 13, two resistors 14, 15 having a same resistance R, and an analog-to-digital converter 16. The defective and reference memory circuits 12 and 13 have memory cells (not shown) manufactured with the same circuit design, layout and in-line process (preferably from a same lot) except that there is one or more defects or defective cells in the defective memory circuit 12. The memory test system 11 provides an operating voltage Vcc and ground voltage GND to both of the defective memory circuit 12 and the reference memory circuit 13 whereby operating currents Id and Ir flow through the resistors 14 and 15 respectively. The memory test system 11 also sends an address signal AD and control signal CS to the defective and reference memory circuits 12 and 13 for retrieving the memory cells of both. The analog-to-digital converter 16 has two inputs receiving voltages on nodes A and B to sense a difference Verr of the received voltages, and has one output sending a digital value representing the voltage difference Verr received from the inputs to the memory test system 11.

When the memory test system 11 sends an memory address (x,y) carried by the address signal AD to both of the defective and reference memory circuits 12 and 13 for retrieving two corresponding memory cells wherein the one of the defective memory circuit is defective, operating currents Id(x,y) and Ir(x,y) are generated and flow through the resistors 14 and 15 respectively. The voltage difference Verr(x,y) received by the analog-to-digital converter 16 is equal to Rx(Id(x,y)−Ir(x,y)).

The current Id(x,y) is an overlay two contributions. One is a leakage current Idd(x,y) which is attributed to the influence of a defect or defective cell, and the other is an operating current Idt(x,y) of all elements of the defective memory circuit 12 which is not affected by the defect or defective cell. Additionally, for minor defects, the currents Idt(x,y) and Ir(x,y) are approximately the same. Thus, the following equations are obtained:

$$Id(x,y)=Idd(x,y)+Ir(x,y) \qquad (1)$$

$$Verr(x,y)=R \times Idd(x,y) \qquad (2)$$

On the other hand, gross defects are not considered in the invention since they will lead a general failure of the memory circuit regardless of the state of the address and control signal.

In the equation (2), the voltage difference Verr(x,y) is directly proportional to the defect related leakage current Idd(x,y). The digital value of the voltage difference Verr(x,y) output from the analog-to-digital converter 16 is processed and stored in the memory test system 11, and compared with a threshold value for a pass/fail decision or characterization of the defective memory circuit 12.

Figure 2:
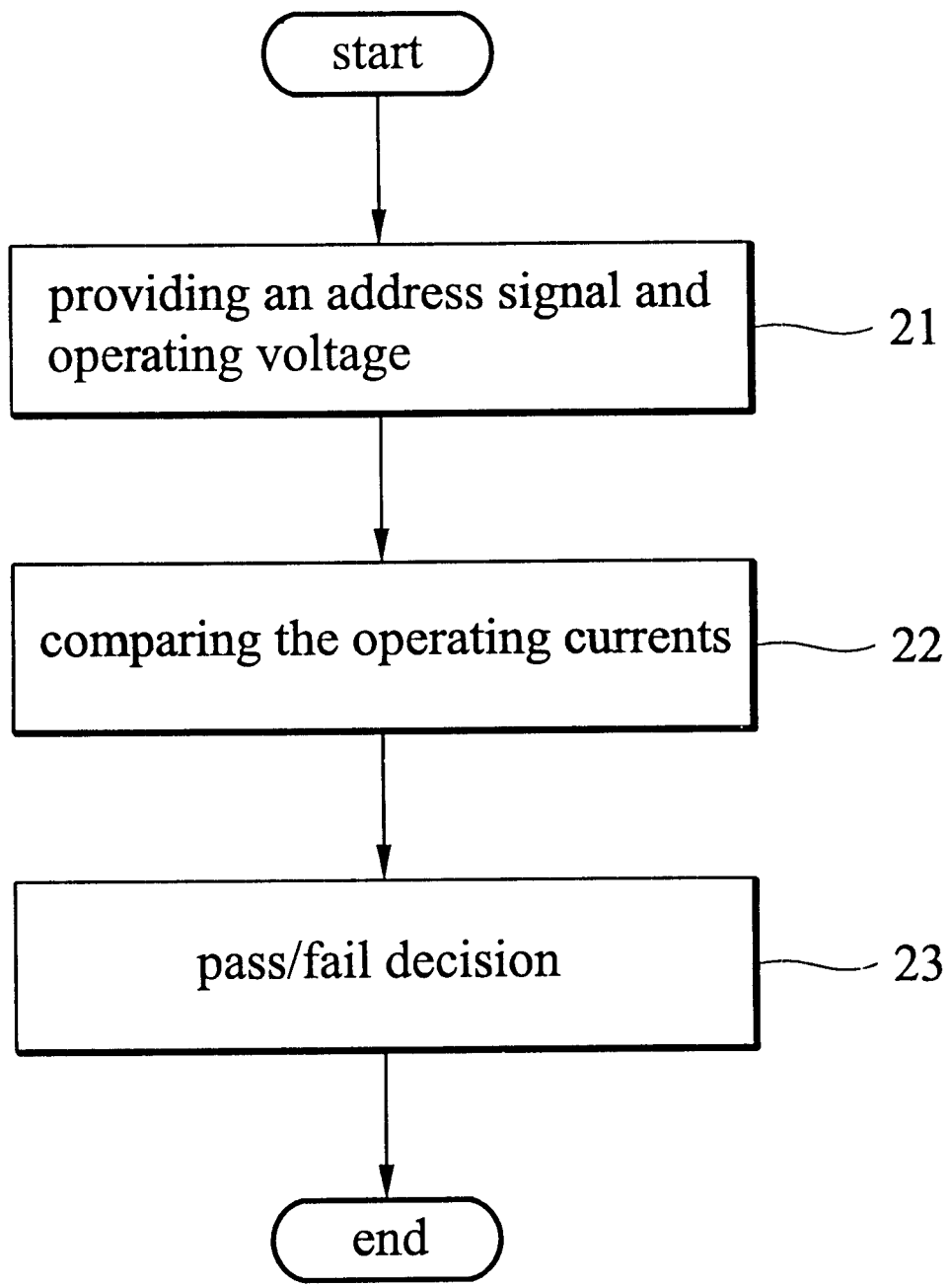
FIG. 2 is a diagram showing a computer-implemented method for identifying state dependent defect related leakage currents in memory circuits according to one embodiment of the invention.

FIG. 2 is a diagram showing a computer-implemented method for identifying state dependent defect related leakage currents in memory circuits according to one embodiment of the invention.

The computer-implemented method of this embodiment is for identifying state dependent defect related leakage currents in a tested memory circuit with a tested cell using a reference memory circuit.

In step 21, an address signal of the tested cell and an operating voltage is provided to the reference and tested memory circuit so that the reference and tested memory circuit operate at a first and second operating current respectively.

In step 22, the first operating current is compared with the second operating current to obtain a difference therebetween.

In step 23, the tested cell is decided as a defective cell when the difference is larger than a threshold value.

In this embodiment, the operating voltage is provided by a power supply in a computer-based test system implementing the method. Further, a resistor is connected between the power supply and the tested memory circuit, and another resistor is connected between the power supply and the reference circuit so that the comparison of first and second operating currents is to compare voltages of two nodes respectively between the first resistor and the tested memory circuit, and the second resistor and the reference circuit.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An apparatus for identifying state dependent defect related leakage currents in a tested circuit with a defect, the apparatus comprising:

a test system providing an input signal and an operating voltage;

a reference circuit the same as the tested circuit but without the defect receiving the input signal and the operating voltage, and operating at a first operating current;

a power supply providing the operating voltage;

a first resistor connected between the power supply and the tested circuit; and a second resistor connected between the power supply and the reference circuit;

wherein the tested circuit also receives the input signal and the operating voltage, and operates at a second operating current, and the test system senses a difference of the first and second operating current by sensing a voltage difference of two nodes respectively between the first resistor and the tested circuit, and the second resistor and the reference circuit.

2. The apparatus as claimed in claim 1 further comprising an analog-to-digital converter connected to the two nodes and outputting a digital value representing the voltage difference to the test system.

3. An apparatus for identifying state dependent defect related leakage currents in a tested memory circuit with a defective cell, the apparatus comprising:

a test system providing an address signal and an operating voltage;

a reference memory circuit the same as the tested memory circuit but without the defective cell receiving the address signal and operating at a first operating current;

a power supply providing the operating voltage;

a first resistor connected between the power supply and the tested memory circuit; and a second resistor connected between the power supply and the reference circuit;

wherein the tested memory circuit also receives the address signal and the operating voltage, and operates at a second operating current, and the test system senses a difference of the first and second operating current by sensing a voltage difference of two nodes respectively between the first resistor and the tested memory circuit, and the second resistor and the reference circuit.

4. The apparatus as claimed in claim 3 further comprising an analog-to-digital converter connected to the two nodes and outputting a digital value representing the voltage difference to the test system.

5. A computer-implemented method for identifying state dependent defect related leakage currents in a tested memory circuit with a tested cell using a reference memory circuit, the method comprising the steps of:

providing an address signal of the tested cell and an operating voltage provided by a power supply to the reference and tested memory circuit so that the reference and tested memory circuit operate at a first and second operating current respectively;

comparing the first and second operating current to obtain a difference of the first and second operating current;

deciding the tested cell as a defective cell when the difference is larger than a threshold value;

providing a first resistor connected between the power supply and the tested memory circuit, and a second resistor connected between the power supply and the reference circuit; and comparing the first and second operating currents by comparing voltages of two nodes respectively between the first resistor and the tested memory circuit, and the second resistor and the reference circuit.

* * * * *